(12) United States Patent
Shin

(10) Patent No.: US 12,089,421 B2
(45) Date of Patent: Sep. 10, 2024

(54) ELECTRONIC DEVICE

(71) Applicant: SK hynix Inc., Icheon-si (KR)

(72) Inventor: Gwang Hyuk Shin, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 307 days.

(21) Appl. No.: 17/587,872

(22) Filed: Jan. 28, 2022

(65) Prior Publication Data
US 2023/0043854 A1 Feb. 9, 2023

(30) Foreign Application Priority Data

Aug. 6, 2021 (KR) .......... 10-2021-0103976

(51) Int. Cl.
*H10B 63/00* (2023.01)
*H01L 29/40* (2006.01)

(52) U.S. Cl.
CPC .......... *H10B 63/80* (2023.02); *H01L 29/408* (2013.01); *H10B 63/24* (2023.02)

(58) Field of Classification Search
CPC ..... H01L 29/408; H01L 29/41; H01L 29/417; H10B 63/20; H10B 63/22; H10B 63/24; H10B 63/80; H10B 63/82; H10B 63/84; H10B 63/845; H10N 70/20; H10N 70/25; H10N 70/801; H10N 70/826; H10N 70/841; H10N 70/881; H10N 70/883; G06F 15/7839
See application file for complete search history.

(56) References Cited

U.S. PATENT DOCUMENTS

2017/0186813 A1* 6/2017 Kim ................. H10N 70/24
2020/0161372 A1 5/2020 Beckmann et al.

* cited by examiner

*Primary Examiner* — Cheung Lee
(74) *Attorney, Agent, or Firm* — Perkins Coie LLP

(57) ABSTRACT

An electronic device comprising a semiconductor memory including at least one memory element is provided. The memory element comprises: a memory area for storing data; and a selection element electrically connected to the memory area and structured to include a first electrode layer, a second electrode layer, and a selection element layer that is interposed between the first electrode layer and the second electrode layer and includes an insulating material doped with a first dopant and a second dopant to form traps for trapping charge carriers, wherein an energy level of a trap formed by the first dopant is greater than an energy level of a trap formed by the second dopant.

19 Claims, 9 Drawing Sheets

ELECTRONIC DEVICE

CROSS-REFERENCE TO RELATED APPLICATION

This patent document claims priority under 35 U.S.C. § 119 to Korean Patent Application No. 10-2021-0103976 filed on Aug. 6, 2021, which is incorporated herein by reference in its entirety.

TECHNICAL FIELD

The technology and implementations disclosed is this patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, or others.

SUMMARY

Various implementations of the disclosed technology provide an electronic device including a memory cell having a selection element layer with securing characteristics of a selection element layer of a memory cell.

In an embodiment, an electronic device includes a semiconductor memory including at least one memory element, which includes: a memory area for storing data; and a selection element electrically connected to the memory area and structured to include a first electrode layer, a second electrode layer, and a selection element layer that is interposed between the first electrode layer and the second electrode layer and includes an insulating material doped with a first dopant and a second dopant to form traps for trapping charge carriers, wherein an energy level of a trap formed by the first dopant is greater than an energy level of a trap formed by the second dopant.

In another embodiment, an electronic device includes a semiconductor memory including at least one memory element, which includes: a memory area for storing data; and a selection element electrically connected to the memory area and including a first electrode layer, a second electrode layer, and a selection element layer that is interposed between the first electrode layer and the second electrode layer and includes an insulating material doped with a first dopant and a second dopant, wherein the first and second dopants have work functions smaller than a work function of at least one of the first electrode layer and the second electrode layer, and wherein the work function of the second dopant is greater than the work function of the first dopant.

DETAILED DESCRIPTION

Figure 1:
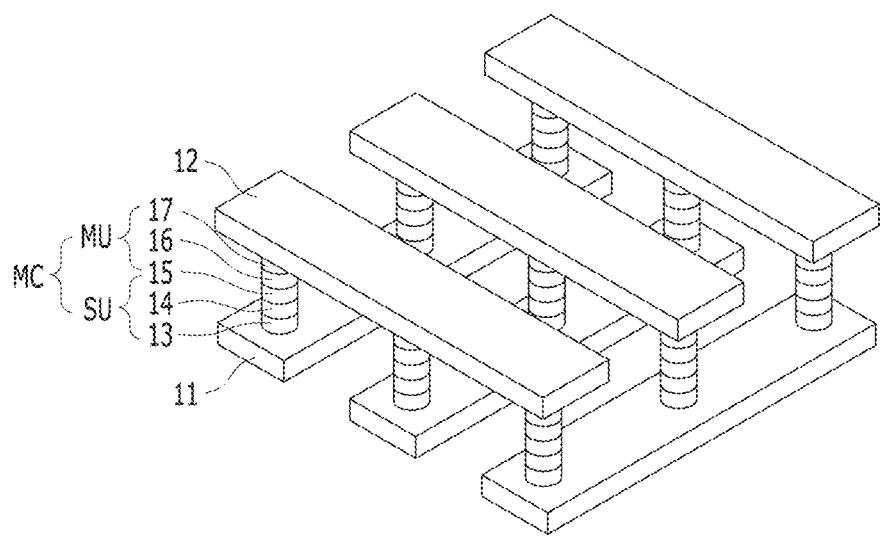
FIG. 1 is a perspective view illustrating a memory device according to an embodiment of the disclosed technology.

Hereinafter, various embodiments of the disclosed technology will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a perspective view illustrating a memory device according to an embodiment of the present disclosure.

Referring to FIG. 1, the memory device of the present embodiment may include a plurality of lower lines 11 extending in a first direction and parallel to each other, a plurality of upper lines 12 extending in a second direction crossing the first direction and parallel to each other while being disposed over the plurality of lower lines 11, and a plurality of memory cells MC interposed between the lower lines 11 and the upper lines 12 at intersections of the lower lines 11 and the upper lines 12, respectively.

Each of the memory cells MC may include a memory unit MU in which data is substantially stored and a selection element unit SU controlling access to the memory unit MU. As an example, the memory cell MC may include a stacked structure of a lower electrode layer 13, a selection element layer 14, an intermediate electrode layer 15, a variable resistance layer 16, and an upper electrode layer 17. Here, the selection element unit SU may include the lower electrode layer 13, the selection element layer 14, and the intermediate electrode layer 15, and the memory unit MU may include the intermediate electrode layer 15, the variable resistance layer 16, and the upper electrode layer 17. The intermediate electrode layer 15 may be shared by the selection element unit SU and the memory unit MU.

The lower electrode layer 13 and the upper electrode layer 17 may be positioned at both ends of the memory cell MC, for example, at lower and upper ends, respectively, and may function to transmit a voltage or current required for the operation of the memory cell MC. The intermediate electrode layer 15 may function to electrically connect the selection element layer 14 and the variable resistance layer 16 while physically separating them. The lower electrode layer 13, the intermediate electrode layer 15, or the upper electrode layer 17 may be formed of various conductive materials, for example, a metal such as platinum (Pt), tungsten (W), aluminum (Al), copper (Cu), tantalum (Ta), or titanium (Ti), a metal nitride such as titanium nitride (TiN) or tantalum nitride (TaN), or a combination thereof. Alternatively, the lower electrode layer 13, the intermediate electrode layer 15, or the upper electrode layer 17 may include a carbon electrode.

The selection element layer 14 may function to prevent current leakage that may occur between the memory cells MC sharing the lower line 11 or the upper line 12. To this end, the selection element layer 14 may have a threshold switching characteristic, that is, a characteristic for blocking or substantially limiting current when a magnitude of an applied voltage is less than a predetermined threshold value and for allowing current to abruptly increase above the threshold value. The threshold value may be referred to as a threshold voltage.

The variable resistance layer 16 may be a part that stores data in the memory cell MC. To this end, the variable resistance layer 16 may have a variable resistance characteristic of switching between different resistance states according to an applied voltage. The variable resistance layer 16 may have a single-layered structure or a multi-layered structure including at least one of materials used for an RRAM, a PRAM, an MRAM, an FRAM, or the like, that is, a metal oxide such as a perovskite-based oxide or a transition metal oxide, a phase change material such as a chalcogenide-based material, a ferromagnetic material, a ferroelectric material, or the like.

However, the layered-structure of the memory cell MC is not limited thereto, and the stacking order of the layers included in the memory cell MC may be changed or at least one of the stacked layers may be omitted. As an example, at least one of the lower electrode layer 13, the intermediate electrode layer 15, and the upper electrode layer 17 may be omitted. Alternatively, as an example, the positions of the selection element layer 14 and the variable resistance layer 16 may be reversed. Alternatively, as an example, one or more layers (not shown) may be added to the memory cell MC to improve fabricating processes or characteristics of the memory cell MC.

In the memory cell MC of the memory device described above, the required operating characteristics of the selection element layer 14 will be described as follows.

Figure 2A:
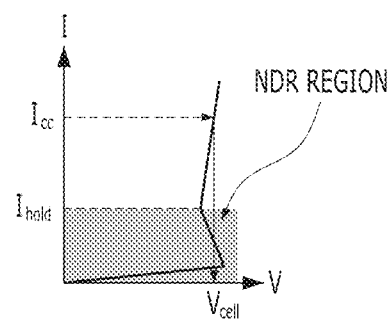
FIGS. 2A and 2B respectively show a current-voltage graph and a voltage-time graph when a selection element layer operates normally.
Figure 2B:
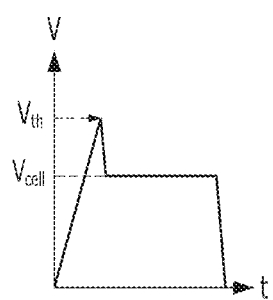
Figure 2C:
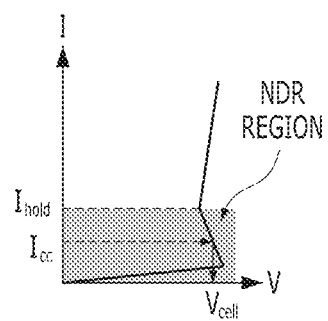
FIGS. 2C and 2D respectively show a current-voltage graph and a voltage-time graph graphs when a selection element layer operates abnormally.
Figure 2D:
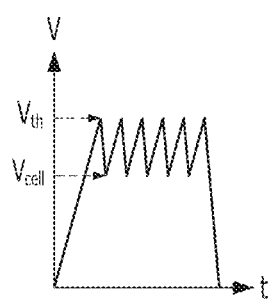

FIGS. 2A and 2B respectively show a current-voltage graph and a voltage-time graph when a selection element layer operates normally, and FIGS. 2C and 2D respectively show a current-voltage graph and a voltage-time graph graphs when a selection element layer operates abnormally.

Prior to description, after a threshold voltage Vth is applied to a selection element layer and the selection element layer is turned on, the selection element layer may operate at an operating voltage Vcell that is lower than the threshold voltage Vth by a predetermined degree. The operating voltage Vcell may include a write voltage for storing data in a memory cell and a read voltage for reading data stored in the memory cell. A current flowing through the selection element layer at the operating voltage Vcell may be referred to as an operating current Icc.

When the voltage applied to the selection element layer is lowered by a predetermined degree than the operating voltage Vcell, a very low current may flow through the selection element layer, so it may be determined that the selection element layer is substantially turned off. The current at this point may be referred to as a hold current Ihold.

Referring to FIGS. 2A and 2B, in a normal operation, the operating current Icc may be greater than the hold current Ihold. That is, the operating current Icc may not exist in the NDR (Negative Differential Resistance) region due to the snap-back according to the current sweep. Accordingly, the operating voltage Vcell according to the time may be substantially constant.

On the other hand, referring to FIGS. 2C and 2D, in an abnormal operation, the operating current Icc may be smaller than the hold current Ihold, and thus the operating current Icc may be located in the NDR region. In this case, oscillation of the operating voltage Vcell may occur. This oscillation may cause problems such as read disturbance in which data stored in the memory cell is not normally read, write disturbance in which data is not normally written in the memory cell, or the like.

As a result, for the normal operation of the selection element layer, it may be required to decrease the hold current Ihold as much as possible so as to lower the hold current Ihold than the operating current Icc. In the present embodiment, a selection element layer that satisfies this requirement will be proposed.

Before describing the selection element layer of the present embodiment, in order to more clearly show the configuration of the selection element layer of the present embodiment and the effect thereof, a selection element layer of a comparative example will be first described.

Figure 3:
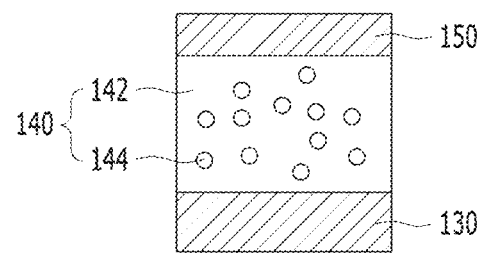
FIG. 3 is a cross-sectional view illustrating a selection element unit of a comparative example.
Figure 4:
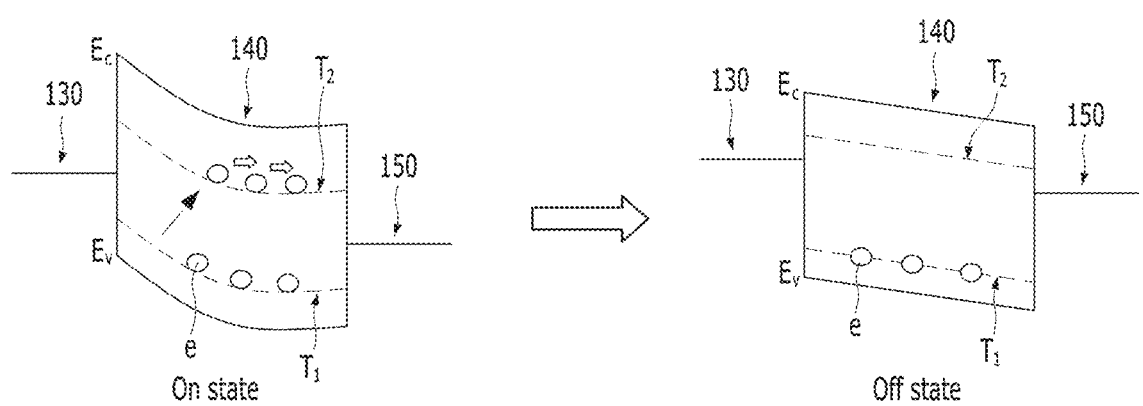
FIG. 4 is an energy band diagram for explaining an on/off operation of the selection element layer of FIG. 3.

FIG. 3 is a cross-sectional view illustrating a selection element unit of a comparative example, and FIG. 4 is an energy band diagram for explaining an on/off operation of the selection element layer of FIG. 3.

Referring to FIG. 3, the selection element unit of the comparative example may include a first electrode layer 130, a second electrode layer 150, and a selection element layer 140 between the first electrode layer 130 and the second electrode layer 150.

The first electrode layer 130 and the second electrode layer 150 may be formed of various conductive materials, for example, a metal such as platinum (Pt), tungsten (W), aluminum (Al), copper (Cu), tantalum (Ta), or titanium (Ti), a metal nitride such as titanium nitride (TiN) or tantalum nitride (TaN), or a combination thereof. The first electrode layer 130 and the second electrode layer 150 may be formed of the same material, and accordingly, the work function of the first electrode layer 130 and the work function of the second electrode layer 150 may be the same as each other. As an example, the first and second electrode layers 130 and 150 may include titanium nitride (TiN) having a work function of 4.4 to 4.6 eV. However, the present disclosure is not limited thereto, and the first electrode layer 130 and the second electrode layer 150 may be formed of different materials, and accordingly, the work function of the first electrode layer 130 and the work function of the second electrode layer 150 may be different from each other.

The selection element layer 140 may include an insulating material layer 142 and a first dopant 144 doped in the insulating material layer 142.

The insulating material layer 142 may include an insulating material having a relatively wide band gap, for example, an insulating material having a band gap of 5.0 eV or more. As an example, the insulating material layer 142 may include a silicon-containing insulating material such as silicon oxide, silicon nitride, silicon oxynitride, or others. Alternatively, as another example, the insulating material layer 142 may include insulating metal oxide, insulating metal nitride, or a combination thereof. As the insulating metal oxide, for example, aluminum oxide may be used, and as the insulating metal nitride, for example, aluminum nitride may be used. The insulating material layer may be structured to form or include structural regions in the insulating material as deep traps that trap charge carriers such as electrons or holes. The deep traps may be intrinsic in the insulating material. Examples of deep traps may include, e.g., dangling bonds or point defects. The deep traps may be compared to swallow traps, which will be described later, based on energy levels required to remove or de-trap trapped charges. The deep trap, which exhibits an energy state in the band gap that is relatively close to the valance band of the band gap may exist in the insulating material layer 142.

The first dopant 144 may include an element capable of creating a shallow trap that provides a movement path for charge or conductive carriers in the insulating material layer 142. The shallow trap may exhibits an energy state in the band gap that is relatively far away from the valance of the band gap. The energy level of the shallow trap may be greater than the work function of at least one of the first and second electrode layers 130 and 150, and may be smaller than the energy level of a conduction band of the insulating material layer 142. To form such a shallow trap, the first dopant 144 may include an element having a work function smaller than the work function of at least one of the first and second electrode layers 130 and 150. As an example, when at least one of the first and second electrode layers 130 and 150 includes titanium nitride (TiN), the first dopant 144 may include gallium (Ga), boron (B), arsenic (As), or others.

The operation of the selection element unit described above will be described with reference to FIG. 4 as follows.

In a state in which the selection element layer 140 is formed and no voltage is applied, charge or conductive carriers, for example, electrons, may be trapped in the deep trap T1 of the selection element layer 140. The energy level of the deep trap T1 may be similar or close to the energy level Ev of a valence band of the insulating material layer for forming the selection element layer 140.

When a voltage greater than or equal to a threshold voltage is applied to the selection element layer 140 through the first and second electrode layers 130 and 150, the selection element layer 140 may be turned on (refer to the drawing on the left side of the arrow). When a voltage greater than or equal to the threshold voltage is applied to the selection element layer 140, the conductive carriers of the deep trap T1 may jump to the shallow trap T2 by thermal emission or tunneling, and the conductive carriers may move through the shallow trap T2 to generate a conductive path connecting the first electrode layer 130 and the second electrode layer 150.

When the voltage applied to the selection element layer 140 in the on-state is reduced, the selection element layer 140 may be turned off at a certain point in time (refer to the drawing on the right side of the arrow). The voltage and current at this time may be referred to as a hold voltage and a hold current, respectively. When the voltage applied to the selection element layer 140 decreases, the number of the conductive carriers moving from the deep trap T1 to the shallow trap T2 may gradually decrease, and when the voltage reaches the hold voltage, the conductive path connecting the first electrode layer 130 and the second electrode layer 150 may be cut.

According to the selection element layer of the present embodiment, the hold voltage and the hold current can be further lowered compared to the selection element layer of the comparative example. This will be described with reference to FIGS. 5 and 6.

Figure 5:
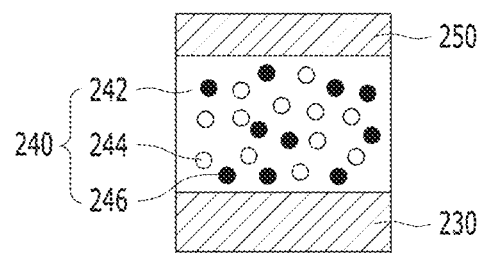
FIG. 5 is a cross-sectional view illustrating a selection element unit according to an embodiment of the disclosed technology.
Figure 6:
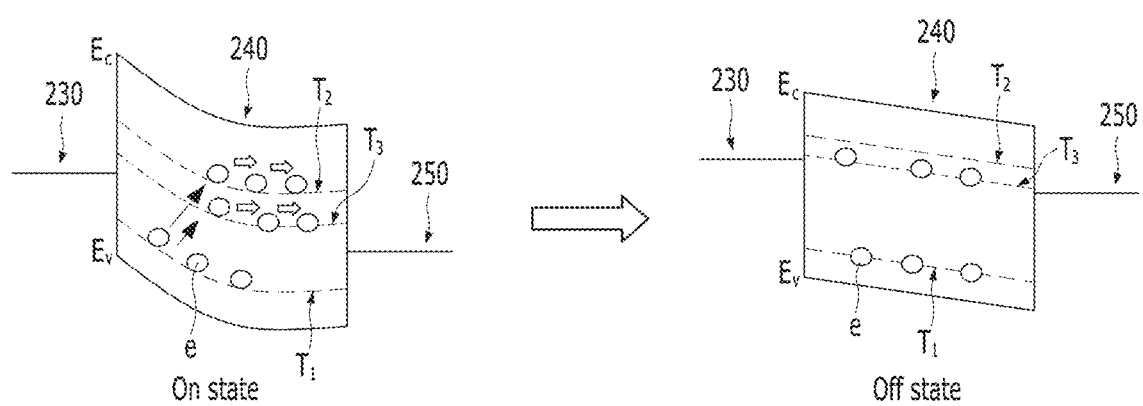
FIG. 6 is an energy band diagram for explaining an on/off operation of the selection element layer of FIG. 5.

FIG. 5 is a cross-sectional view illustrating a selection element unit according to an embodiment of the present disclosure, and FIG. 6 is an energy band diagram for explaining an on/off operation of the selection element layer of FIG. 5.

Referring to FIG. 5, the selection element unit according to the present embodiment may include a first electrode layer 230, a second electrode layer 250, and a selection element layer 240 between the first electrode layer 230 and the second electrode layer 250.

The first electrode layer 230 and the second electrode layer 250 may be formed of or include various conductive materials, for example, a metal such as platinum (Pt), tungsten (W), aluminum (Al), copper (Cu), tantalum (Ta), or titanium (Ti), a metal nitride such as titanium nitride (TiN) or tantalum nitride (TaN), or a combination thereof. The first electrode layer 230 and the second electrode layer 250 may be formed of or include the same material, and accordingly, the work function of the first electrode layer 230 and the work function of the second electrode layer 250 may be the same as each other. As an example, the first and second electrode layers 230 and 250 may include titanium nitride (TiN) having a work function of 4.4 to 4.6 eV. However, the present disclosure is not limited thereto, and the first electrode layer 230 and the second electrode layer 250 may be formed of different materials, and accordingly, the work function of the first electrode layer 230 and the work function of the second electrode layer 250 may be different from each other.

The selection element layer 240 may include an insulating material layer 242, and first and second dopants 244 and 246 doped in the insulating material layer 242.

The insulating material layer 242 may include an insulating material having a relatively wide band gap, for example, an insulating material having a band gap of 5.0 eV or more. As an example, the insulating material layer 242 may include a silicon-containing insulating material such as silicon oxide, silicon nitride, silicon oxynitride, or the like.

Alternatively, as another example, the insulating material layer 242 may include insulating metal oxide, insulating metal nitride, or a combination thereof. As the insulating metal oxide, for example, aluminum oxide may be used, and as the insulating metal nitride, for example, aluminum nitride may be used. As explained above, the trapping phenomenon occurs in the insulating material layer 242 and a deep trap may exist in the insulating material layer 242.

The first dopant 244 may include an element capable of creating a shallow trap that provides a primary movement path for conductive carriers within the insulating material layer 242. The energy level of the shallow trap may be greater than the energy level of the deep trap. To form such a shallow trap, the first dopant 244 may include an element having a work function smaller than the work function of at least one of the first and second electrode layers 230 and 250.

The second dopant 246 may include an element capable of creating a moderate trap that provides a secondary movement path for the conductive carriers within the insulating material layer 242. The moderate trap has the energy level between the energy level of the deep trap and the energy level of the shallow trap. The energy level of the moderate trap may be greater than the work function of at least one of the first and second electrode layers 230 and 250, and may be smaller than the energy level of the shallow trap. To form such a moderate trap, the second dopant 246 may include an element having a work function that is smaller than the work function of at least one of the first and second electrode layers 230 and 250 and is greater than the work function of the first dopant 244.

Furthermore, the first and second dopants 244 and 246 may include a metal element. In the case of this metal element, since density of states (DOS) exists near a Fermi level, it may have a greater number of carriers, for example, electrons or holes, than a semiconductor material. Accordingly, when a metal is used as the first dopant 244 forming a shallow trap and a second dopant 246 forming a moderate trap, a larger current may flow at the same voltage as compared to a case in which a semiconductor is used as at least one of the first and second dopants 244 and 246.

As an example, when at least one of the first and second electrode layers 230 and 250 includes titanium nitride (TiN) having a work function of 4.4 to 4.6 eV, each of the first and second dopants 244 and 246 may include one of the metal elements exemplified in [Table 1] below. However, even in this case, it may be assumed that the work function of the second dopant 246 is greater than the work function of the first dopant 244. For example, when the first dopant 244 includes Hf, Zn, Mg, or Sc, the second dopant 246 may include Al, Ti, V, Mn, Zr, Nb, or Ta.

TABLE 1

| Metal | Work function (eV) |
|---|---|
| Hf | 3.9 |
| Zn | 3.6 |
| Mg | 3.66 |
| Sc | 3.5 |
| Al | 4.3 |
| Ti | 4.33 |
| V | 4.3 |
| Mn | 4.1 |
| Zr | 4.05 |

In addition, the first dopant 244 may provide a primary conductive path, and the second dopant 246 may provide a secondary conductive path. Therefore, in the insulating material layer 242, the concentration of the first dopant 244 may be greater than the concentration of the second dopant 246.

The operation of the selection element unit described above will be described with reference to FIG. 6 as follows.

In a state in which the selection element layer 240 is formed and no voltage is applied, conductive carriers, for example, electrons, may be trapped in the deep trap T1 of the selection element layer 240. The energy level of the deep trap T1 may be similar to the energy level Ev of a valence band of the insulating material layer for forming the selection element layer 240.

When a voltage greater than or equal to a threshold voltage is applied to the selection element layer 240 through the first and second electrode layers 230 and 250, the selection element layer 240 may be turned on (refer to the drawing on the left side of the arrow). When a voltage greater than or equal to the threshold voltage is applied to the selection element layer 240, the conductive carriers of the deep trap T1 may jump to the shallow trap T2 by thermal emission or tunneling, and the conductive carriers may move through the shallow trap T2 to generate a conductive path connecting the first electrode layer 230 and the second electrode layer 250. At this time, some of the conductive carriers may jump to the moderate trap T3, and the conductive carriers also move through the moderate trap T3, thereby generating a conductive path connecting the first electrode layer 230 and the second electrode layer 250. Since the conductive path is formed through both the shallow trap T2 and the moderate trap T3, it may be possible to obtain a conductive path having the same degree even when the threshold voltage is reduced compared to the comparative example. Thus, the selection element layer 240 may be turned on even at a lower threshold voltage. The number/density of conductive paths through the moderate trap T3 may be smaller than the number/density of conductive paths through the shallow trap T2.

When the voltage applied to the selection element layer 240 in the on-state is reduced, the selection element layer 240 may be turned off at a certain point in time (refer to the right drawing of the arrow). The voltage and current at this time may be referred to as a hold voltage and a hold current, respectively. When the voltage applied to the selection element layer 240 decreases, the number of the conductive carriers moving from the deep trap T1 to the shallow trap T2 and the number of the conductive carriers moving from the deep trap T1 to the moderate trap T3 may gradually decrease, and when the voltage reaches the hold voltage, the conductive path connecting the first electrode layer 230 and the second electrode layer 250 may be cut.

At this time, when a hold voltage equal to or similar to the hold voltage of the comparative example described in FIGS. 3 and 4 is applied, even if the conductive carriers do not jump to the shallow trap T2, they may jump to the moderate trap T3, and thus the conductive path may be maintained. That is, the selection element layer 240 may not be substantially turned off. Accordingly, the conductive path by the moderate trap T3 may be cut by lowering the hold voltage compared to the comparative example. That is, in the present embodiment, the hold voltage for turning the selection element layer 240 into the off state may decrease, and accordingly, the hold current may also decrease.

Figure 7:
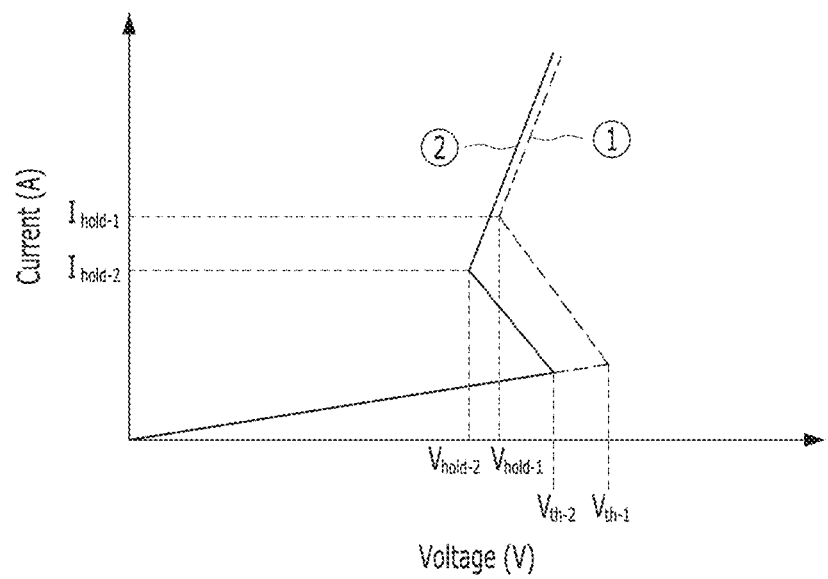
FIG. 7 is a current-voltage graph for comparing an operation of the selection element layer of the comparative example and an operation of the selection element layer of the disclosed technology.

FIG. 7 is a current-voltage graph for comparing an operation of the selection element layer of the comparative example and an operation of the selection element layer of the present disclosure. A dotted line ① shows a current-voltage graph during operation of the selection element layer of the comparative example, and a solid line ② shows a current-voltage graph during operation of the selection element layer of the present embodiment.

Referring to FIG. 7, the threshold voltage Vth-2 at which the selection element layer of the present embodiment is turned on may be smaller than the threshold voltage Vth-1 at which the selection element layer of the comparative example is turned on.

In addition, compared to the hold voltage Vhold-1 and the hold current Ihold-1 at which the selection element layer of the comparative example is turned off, the hold voltage Vhold-2 and the hold current Ihold-2 at which the selection element layer of the present embodiment is turned off may be smaller.

As a result, according to the selection element layer of the present embodiment, the threshold voltage may decrease, and the hold voltage/hold current may decrease so that operational defects such as read disturbance/write disturbance may be prevented.

Figure 8:
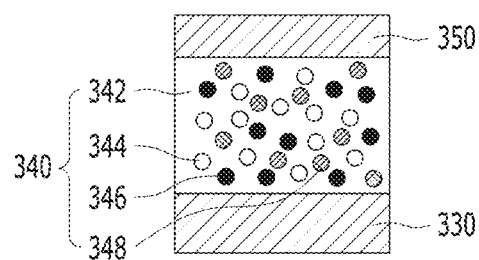
FIG. 8 is a cross-sectional view illustrating a selection element unit according to another embodiment of the disclosed technology.

FIG. 8 is a cross-sectional view illustrating a selection element unit based on another embodiment of the present disclosure. Differences from the above-described embodiment will be mainly described.

Referring to FIG. 8, the selection element unit according to the present embodiment may include a first electrode layer 330, a second electrode layer 350, and a selection element layer 340 between the first electrode layer 330 and the second electrode layer 350.

The selection element layer 340 may include an insulating material layer 342, and first, second, and third dopants 344, 346, and 348 doped in the insulating material layer 342.

The first dopant 344 may include an element capable of creating a shallow trap that provides a primary movement path for conductive carriers within the insulating material layer 342.

The second dopant 346 may include an element capable of creating a first moderate trap that provides a secondary movement path for the conductive carriers within the insulating material layer 342. The energy level of the first moderate trap may be greater than the work function of at least one of the first and second electrode layers 330 and 350, and may be smaller than the energy level of the shallow trap. In order to form the first moderate trap, the second dopant 346 may include an element having a work function that is smaller than the work function of at least one of the first and second electrode layers 330 and 350 and is greater than the work function of the first dopant 344.

The third dopant 348 may include an element capable of creating a second moderate trap that provides a secondary movement path for the conductive carriers within the insulating material layer 342. The energy level of the second moderate trap may be greater than the work function of at least one of the first and second electrode layers 330 and 350, and may have a value between the energy level of the shallow trap and the energy level of the first moderate trap. In order to form the second moderate trap, the third dopant 348 may include an element having a work function that is smaller than the work function of at least one of the first and second electrode layers 330 and 350 and is greater than the work function of the first dopant 344 while being smaller than the work function of the second dopant 346.

Furthermore, the first to third dopants 344, 346, and 348 may include a metal element.

As an example, when at least one of the first and second electrode layers 330 and 350 includes titanium nitride (TiN) having a work function of 4.4 to 4.6 eV, each of the first to third dopants 344, 346, and 348 may include one of the metal elements exemplified in [Table 1] above. However, even in this case, it may be assumed that the work function of the second dopant 346 is greater than the work function of the first dopant 344, and the work function of the third dopant 348 has a value between the work function of the first dopant 344 and the work function of the second dopant 346. For example, when the first dopant 344 includes Hf, Zn, Mg, or Sc, the second dopant 346 may include Al, Ti, V, Nb, or Ta, and the third dopant 348 may include Mn or Zr.

In addition, since the first dopant 344 provides a primary conductive path, and the second and third dopants 346 and 348 provide a secondary conductive path, the concentration of the first dopant 344 in the insulating material layer 342 is may be greater than the concentration of each of the second and third dopants 346 and 348.

According to the present embodiment, the selection element layer 340 may be substantially turned off when the conductive paths through both the first and second moderate traps are cut. Accordingly, a hold voltage for turning the selection element layer 240 into an off state may be further reduced, and accordingly, a hold current may also be further reduced.

Figure 9:
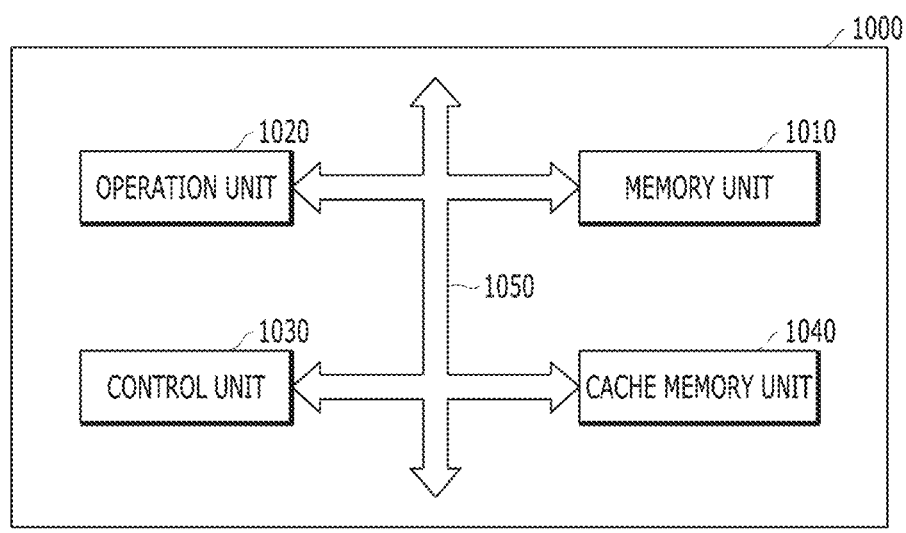
FIG. 9 is an example of configuration diagram of a microprocessor implementing memory circuitry based on the disclosed technology.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include various registers such as a data register, an address register, a floating point register and so on. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the embodiments. For example, the memory unit 1010 may include a memory area for storing data; and a selection element electrically connected to the memory area and structured to include a first electrode layer, a second electrode layer, and a selection element layer that is interposed between the first electrode layer and the second electrode layer and includes an insulating material doped with a first dopant and a second dopant to form traps for trapping charge carriers, wherein an energy level of a trap formed by the first dopant is greater than an energy level of a trap formed by the second dopant. Through this, operating characteristics of the memory unit 101 may be improved. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
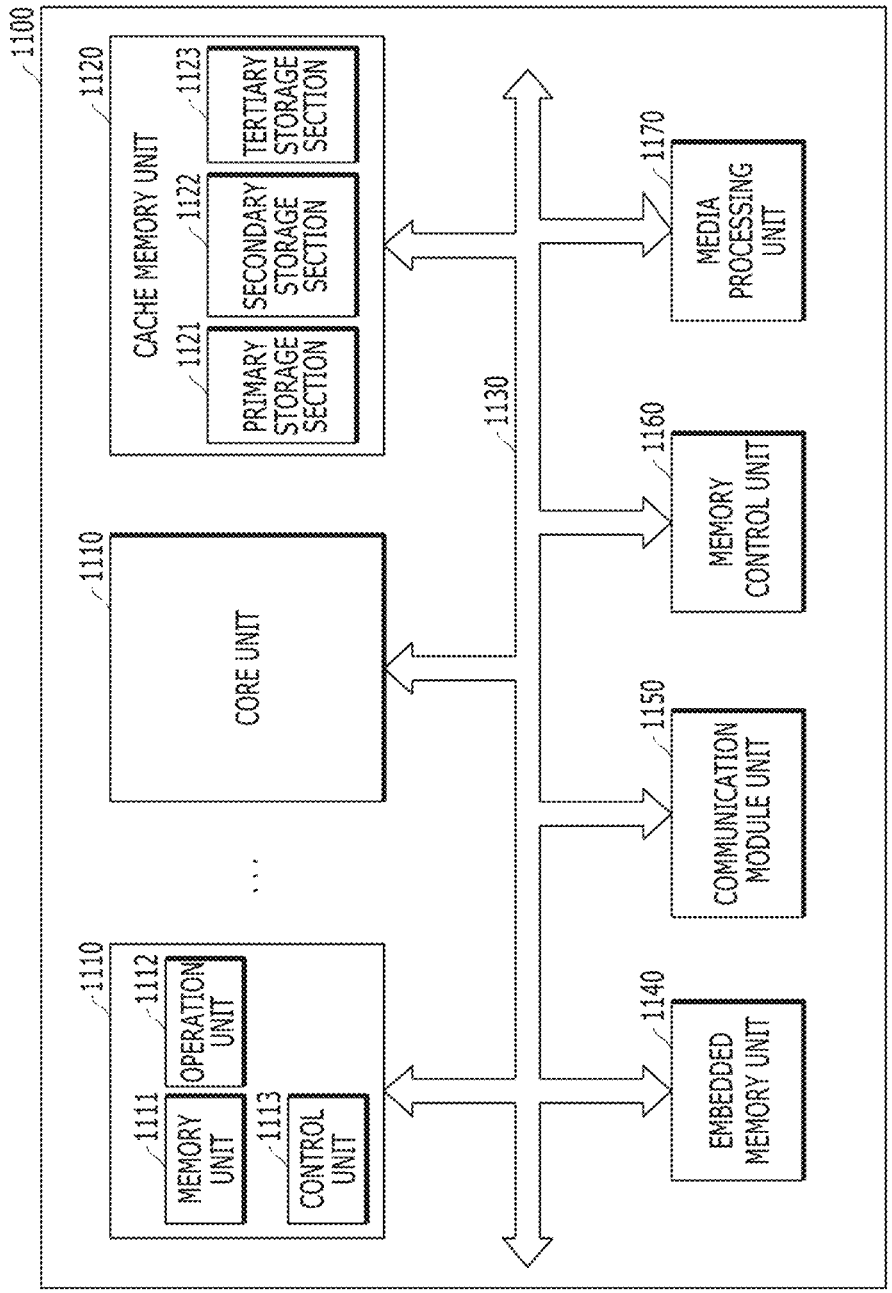
FIG. 10 is an example of configuration diagram of a processor implementing memory circuitry based on the disclosed technology.

FIG. 10 is an example of configuration diagram of a processor implementing memory circuitry based on the disclosed technology.

Referring to FIG. 10, a processor 1100 may improve performance and realize multi-functionality by including various functions other than those of the above-described microprocessor 1000. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present embodiment is a part which performs arithmetic logic operations for data inputted from an external device, and may include a memory unit 1111, an operation unit 1112 and a control unit 1113. The memory unit 1111, the operation unit 1112 and the control unit 1113 may be substantially the same as the memory unit 1010, the operation unit 1020 and the control unit 1030.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a memory area for storing data; and a selection element electrically connected to the memory area and structured to include a first electrode layer, a second electrode layer, and a selection element layer that is interposed between the first electrode layer and the second electrode layer and includes an insulating material doped with a first dopant and a second dopant to form traps for trapping charge carriers, wherein an energy level of a trap formed by the first dopant is greater than an energy level of a trap formed by the second dopant. Through this, operating characteristics of the cache memory unit 1120. As a consequence, it is possible to improve operating characteristics of the processor 1100.

Although it was shown in this embodiment that all the primary, secondary and tertiary storage sections 1121, 1122 and 1123 are configured inside the cache memory unit 1120, at least one of the primary, secondary and tertiary storage sections 1121, 1122 and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120 and external device and allows data to be efficiently transmitted.

The processor 1100 according to the present embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local region network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
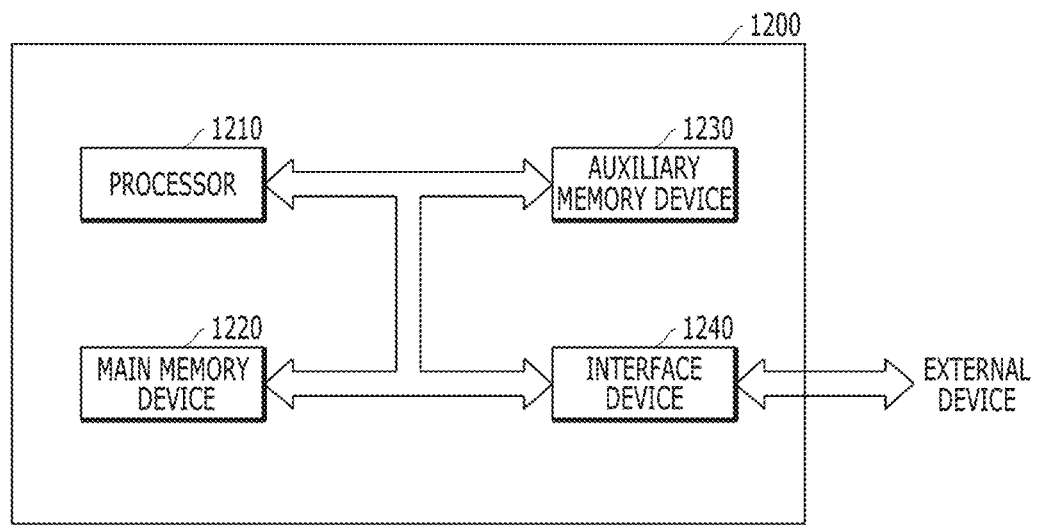
FIG. 11 is an example of configuration diagram of a system implementing memory circuitry based on the disclosed technology.

FIG. 11 is an example of configuration diagram of a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may substantially the same as the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the embodiments. For example, the main memory device 1220 or the auxiliary memory device 1230 may include a memory area for storing data; and a selection element electrically connected to the memory area and structured to include a first electrode layer, a second electrode layer, and a selection element layer that is interposed between the first electrode layer and the second electrode layer and includes an insulating material doped with a first dopant and a second dopant to form traps for trapping charge carriers, wherein an energy level of a trap formed by the first dopant is greater than an energy level of a trap formed by the second dopant. Through this, operating characteristics of the main memory device 1220 or the auxiliary memory device 1230 may be improved. As a consequence, it is possible to improve operating characteristics of the system 1200.

Also, the main memory device 1220 or the auxiliary memory device 1230 may include a memory system (see the reference numeral 1300 of FIG. 12) in addition to the above-described semiconductor device or without including the above-described semiconductor device.

The interface device 1240 may be to perform exchange of commands and data between the system 1200 of the present embodiment and an external device. The interface device 1240 may be a keypad, a keyboard, a mouse, a speaker, a mike, a display, various human interface devices (HIDs), a communication device, and so on. The communication device may be substantially the same as the above-described communication module unit 1150.

Figure 12:
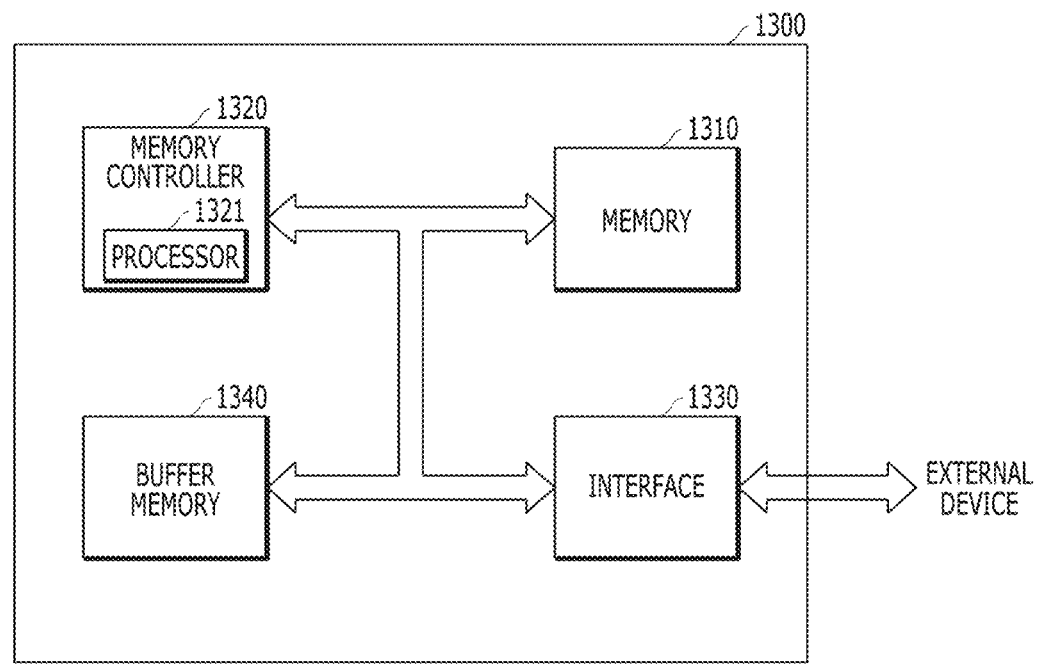
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1300 may include a memory 1310 which has a nonvolatile characteristic as a component for storing data, a controller 1320 which controls the memory 1310, an interface 1330 for connection with an external device, and a buffer memory 1340 for storing data temporarily for efficiently transferring data between the interface 1330 and the memory 1310. The memory system 1300 may simply mean a memory for storing data, and may also mean a data storage device for conserving stored data in a long term. The memory system 1300 may be a disk type such as a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1310 or the buffer memory 1340 may include one or more of the above-described semiconductor devices in accordance with the embodiments. For example, the memory 1310 or the buffer memory 1340 may include a memory area for storing data; and a selection element electrically connected to the memory area and structured to include a first electrode layer, a second electrode layer, and a selection element layer that is interposed between the first electrode layer and the second electrode layer and includes an insulating material doped with a first dopant and a second dopant to form traps for trapping charge carriers, wherein an energy level of a trap formed by the first dopant is greater than an energy level of a trap formed by the second dopant. Through this, operating characteristics of the memory 1310 or the buffer memory 1340 may be improved. As a consequence, it is possible to improve operating characteristics of the memory system 1300.

The memory 1310 or the buffer memory 1340 may include various memories such as a nonvolatile memory or a volatile memory, in addition to the above-described semiconductor device or without including the above-described semiconductor device.

The controller 1320 may control exchange of data between the memory 1310 and the interface 1330. To this end, the controller 1320 may include a processor 1321 for performing an operation for, processing commands inputted through the interface 1330 from an outside of the memory system 1300 and so on.

The interface 1330 is to perform exchange of commands and data between the memory system 1300 and the external device. In the case where the memory system 1300 is a card type or a disk type, the interface 1330 may be compatible with interfaces which are used in devices having a card type or a disk type, or be compatible with interfaces which are used in devices similar to the above mentioned devices. The interface 1330 may be compatible with one or more interfaces having a different type from each other.

Features in the above examples of electronic devices or systems in FIGS. 9-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

What is claimed is:

1. An electronic device comprising a semiconductor memory including at least one memory element, the memory element comprising:
   a memory area for storing data; and
   a selection element electrically connected to the memory area and structured to include a first electrode layer, a second electrode layer, and a selection element layer that is interposed between the first electrode layer and the second electrode layer and includes an insulating material doped with a first dopant and a second dopant,
   wherein the first dopant and the second dopant form traps for trapping charge carriers,
   wherein an energy level of a trap formed by the first dopant is greater than an energy level of a trap formed by the second dopant.

2. The electronic device according to claim 1, wherein the first dopant has a work function smaller than a work function of at least one of the first electrode layer and the second electrode layer.

3. The electronic device according to claim 2, wherein a work function of the second dopant is smaller than the work function of at least one of the first electrode layer and the second electrode layer, and is greater than the work function of the first dopant.

4. The electronic device according to claim 3, wherein at least one of the first electrode layer and the second electrode layer has the work function of 4.4 to 4.6 eV, and
   wherein each of the first dopant and the second dopant includes a metal including at least one of Hf, Zn, Mg, Sc, Al, Ti, V, Mn, Zr, Nb, or Ta.

5. The electronic device according to claim 1, wherein the first dopant and the second dopant include metals.

6. The electronic device according to claim 1, wherein the first dopant provides a primary path for the charge carriers within the insulating material, and
   wherein the second dopant provides a secondary path for the charge carriers within the insulating material.

7. The electronic device according to claim 6, wherein a concentration of the first dopant is greater than a concentration of the second dopant.

8. The electronic device according to claim 1, wherein the selection element layer further includes a third dopant, and
   wherein an energy level of a trap formed by the third dopant has a value between the energy level of the trap formed by the first dopant and the energy level of the trap formed by the second dopant.

9. The electronic device according to claim 8, wherein a work function of the third dopant is smaller than a work function of at least one of the first electrode layer and the second electrode layer and is greater than a work function of the first dopant while being smaller than a work function of the second dopant.

10. The electronic device according to claim 9, wherein at least one of the first electrode layer and the second electrode layer has the work function of 4.4 to 4.6 eV, and
    wherein each of the first dopant, second dopant, and the third dopant including at least one of Hf, Zn, Mg, Sc, Al, Ti, V, Mn, Zr, Nb, or Ta.

11. The electronic device according to claim 8, wherein the first dopant, the second dopant, and the third dopant include metals.

12. The electronic device according to claim 8, wherein the first dopant provides a primary path for the charge carriers within the insulating material, and
    wherein the second dopant and the third dopant provide a secondary path for the charge carriers within the insulating material.

13. The electronic device according to claim 12, wherein a concentration of the first dopant is greater than a concentration of the second dopant and a concentration of the third dopant.

14. The electronic device according to claim 1, wherein the semiconductor memory further includes:
    a plurality of lower lines extending in a first direction; and
    a plurality of upper lines extending in a second direction intersecting the first direction,
    wherein the memory element is interposed between the lower lines and the upper lines at each of intersections of the lower lines and the upper lines.

15. The electronic device according to claim 1, further comprising a microprocessor which includes:
- a control unit configured to receive a signal including a command from an outside of the microprocessor, and performs extracting, decoding of the command, or controlling input or output of a signal of the microprocessor;
- an operation unit configured to perform an operation based on a result that the control unit decodes the command; and
- a memory unit configured to store data for performing the operation, data corresponding to a result of performing the operation, or an address of data for which the operation is performed,
- wherein the semiconductor memory is part of the memory unit in the microprocessor.

16. The electronic device according to claim 1, further comprising a processor which includes:
- a core unit configured to perform, based on a command inputted from an outside of the processor, an operation corresponding to the command, by using data;
- a cache memory unit configured to store data for performing the operation, data corresponding to a result of performing the operation, or an address of data for which the operation is performed; and
- a bus interface connected between the core unit and the cache memory unit, and configured to transmit data between the core unit and the cache memory unit,
- wherein the semiconductor memory is part of the cache memory unit in the processor.

17. The electronic device according to claim 1, further comprising a processing system which includes:
- a processor configured to decode a command received by the processor and control an operation for information based on a result of decoding the command;
- an auxiliary memory device configured to store a program for decoding the command and the information;
- a main memory device configured to call and store the program and the information from the auxiliary memory device such that the processor can perform the operation using the program and the information when executing the program; and
- an interface device configured to perform communication between at least one of the processor, the auxiliary memory device and the main memory device and the outside,
- wherein the semiconductor memory is part of the auxiliary memory device or the main memory device in the processing system.

18. The electronic device according to claim 1, further comprising a memory system which includes:
- a memory configured to store data and conserve stored data regardless of power supply;
- a memory controller configured to control input and output of data to and from the memory according to a command inputted from an outside;
- a buffer memory configured to buffer data exchanged between the memory and the outside; and
- an interface configured to perform communication between at least one of the memory, the memory controller and the buffer memory and the outside,
- wherein the semiconductor memory is part of the memory or the buffer memory in the memory system.

19. An electronic device comprising a semiconductor memory including at least one memory element, the memory element comprising:
- a memory area for storing data; and
- a selection element electrically connected to the memory area and including a first electrode layer, a second electrode layer, and a selection element layer that is interposed between the first electrode layer and the second electrode layer and includes an insulating material doped with a first dopant and a second dopant,
- wherein the first and second dopants have work functions smaller than a work function of at least one of the first electrode layer and the second electrode layer, and
- wherein the work function of the second dopant is greater than the work function of the first dopant.

* * * * *